US010784899B2

United States Patent
Khude et al.

(10) Patent No.: US 10,784,899 B2
(45) Date of Patent: Sep. 22, 2020

(54) METHOD AND APPARATUS FOR DETERMINING SCALING FACTORS IN FIXED-POINT DECODER

(71) Applicant: NXP USA, Inc., Austin, TX (US)

(72) Inventors: Nilesh N. Khude, Maharashtra (IN); Sri Varsha Rottela, Andhra Pradesh (IN); Vijay Ahirwar, Maharashtra (IN); Hari Balakrishnan, Tamil Nadu (IN); Hanchao Yang, San Jose, CA (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/746,183

(22) Filed: Jan. 17, 2020

(65) Prior Publication Data

US 2020/0235758 A1 Jul. 23, 2020

Related U.S. Application Data

(60) Provisional application No. 62/854,844, filed on May 30, 2019, provisional application No. 62/795,876, filed on Jan. 23, 2019.

(51) Int. Cl.
*H03M 13/45* (2006.01)
*H03M 13/39* (2006.01)
(Continued)

(52) U.S. Cl.
CPC ........ *H03M 13/3927* (2013.01); *G06N 20/00* (2019.01); *H03M 13/1105* (2013.01); *H03M 13/3746* (2013.01); *H03M 13/658* (2013.01)

(58) Field of Classification Search
CPC .. H03M 13/37; H03M 13/3784; H03M 13/39; H03M 13/3905; H03M 13/3927; H03M 13/3933; H03M 13/658; H03M 13/1105; H03M 13/1111; H03M 13/1128; H03M 13/3746; H03M 13/3753; G06N 20/00
See application file for complete search history.

(56) References Cited

U.S. PATENT DOCUMENTS 8,286,048 B1 * 10/2012 Chen ................... H03M 13/1128
714/752
8,543,883 B2 * 9/2013 Chen ................... H03M 13/1128
714/752

(Continued)

*Primary Examiner* — Siu M Lee

(57) ABSTRACT

Data from a communications channel is decoded by receiving data bits corresponding to encoded data, determining a set of data representations from the data bits, distributing the set of data representations into bins across a dynamic range to generate a distribution of the data representations, assigning a respective intermediate scale factor to each bin, deriving a set of moments from the intermediate scale factors, combining the moments into a scaling factor, scaling the data representations by the scaling factor, and sending the scaled data representations to a decoder. The data representations may be a histogram or cumulative distribution function of log-likelihood ratios (LLRs) or values based on channel estimates. In an iterative implementation performed until a stopping condition is met, the data representations may be scaled down on later iterations to avoid saturation. A correction factor may be applied to update the scaling factor for later data bits.

27 Claims, 4 Drawing Sheets

(51) Int. Cl.
*H03M 13/37* (2006.01)
*G06N 20/00* (2019.01)
*H03M 13/00* (2006.01)
*H03M 13/11* (2006.01)

(56) References Cited

U.S. PATENT DOCUMENTS

| | | | |
|---|---|---|---|
| 10,341,053 B2 * | 7/2019 | Ahirwar | H03M 13/3723 |
| 10,574,273 B1 * | 2/2020 | Rottela | H03M 13/3927 |
| 2013/0051444 A1 * | 2/2013 | Roh | H03M 13/6577 |
| | | | 375/222 |
| 2019/0222225 A1 | 7/2019 | Ahirwar | |

* cited by examiner

METHOD AND APPARATUS FOR DETERMINING SCALING FACTORS IN FIXED-POINT DECODER

CROSS REFERENCE TO RELATED APPLICATIONS

This disclosure claims the benefit of copending, commonly-assigned U.S. Provisional Patent Applications Nos. 62/795,876, filed Jan. 23, 2019, and 62/854,844, filed May 30, 2019, each which is hereby incorporated by reference herein in its respective entirety.

FIELD OF USE

This disclosure relates to determination of scale factors in fixed-point decoder circuitry. More particularly, this disclosure relates to dynamic scaling of data representations in fixed-point error-correcting decoders used for data transmission.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Many communication systems use some form of error correcting coding for data transmission. For example, a transmitter may use an error correcting encoding operation to add parity or other bits in addition to the actual data bits, and a receiver performs a reverse error correcting decoding operation to recognize the portion of the actual data bits from the received data bits. At the receiver, decisions regarding the received data bits are represented as log-likelihood ratios (LLRs), which are then sent to a decoder. A high LLR magnitude corresponds to high reliability of the respective data bit—i.e., the data bit is less affected by channel noise and is more likely to be accurately decoded. On the other hand, a low LLR magnitude (e.g., close to zero) corresponds to low reliability—i.e., the received data bit can be ambiguous for decoders. The LLR values corresponding to received data bits at a receiver may vary significantly, due to varying channel conditions, different modulation and coding schemes (MCSs), changing signal power level of the received signal, and/or the like. Thus, it remains challenging for a decoder to maintain decoding accuracy for certain data bits, especially when the magnitudes of the LLR values are relatively low (i.e., close to zero).

SUMMARY

According to implementations of the subject matter of this disclosure, a method of decoding data representations derived from a communications channel includes receiving data bits corresponding to encoded data in the communications channel, determining a set of data representations from the data bits, distributing the set of data representations into bins across a dynamic range to generate a distribution of the data representations, assigning a respective intermediate scale factor to each bin, deriving a set of moments from the intermediate scale factors, combining the moments into a scaling factor, scaling the data representations by the scaling factor, and sending the scaled data representations to a decoder.

In a first implementation of such a method, the determining a set of data representations from the data bits may include determining log-likelihood ratio (LLR) values from the data bits.

In a second implementation of such a method, the determining a set of data representations from the data bits may include determining values from the data bits based on channel estimates.

In a third implementation of such a method, the distributing the set of data representations may include generating a histogram.

In a fourth implementation of such a method, the distributing the set of data representations may include generating a cumulative distribution function.

A fifth implementation of such a method further includes, when the data bits are encoded with a low-density parity-check (LDPC) code, adjusting the distribution based on parameters of the data bits.

In a variant of the fifth implementation, the adjusting the distribution based on parameters of the data bits may include adjusting the distribution based on at least one of (a) a number of shortening bits per codeword, (b) a number of punctured bits per codeword, and (c) a number of repeated bits per codeword.

In a sixth implementation of such a method, the combining the moments may include combining the moments in a weighted summation.

In a seventh implementation of such a method, the combining the moments may include applying the moments to a machine learning model.

An eighth implementation of such a method, may further includes monitoring channel characteristics of different channels, where at least one of the assigning, the deriving and the combining is performed differently for different channels according to the channel characteristics, and at least one channel has a different scaling factor than other channels.

A ninth implementation of such a method may further include discarding data representations below a noise threshold, where the intermediate scale factors are based on noise variance.

In a tenth implementation of such a method, the combining the moments into a scaling factor may include grouping the bins into ranges, and deriving separate scaling factors for each range.

An eleventh implementation of such a method may be iterative and may include scaling down the data representations on later iterations to avoid saturation.

A twelfth implementation of such a method may further include applying a correction factor to update the scaling factor for later data bits in a packet.

According to implementations of the subject matter of this disclosure, apparatus for decoding data representations derived from a communications channel includes a receiver configured to receive data bits corresponding to encoded data in the communications channel, processing circuitry configured to determine a set of data representations from the data bits, distribute the set of data representations into bins across a dynamic range to generate a distribution of the data representations, assign a respective intermediate scale factor to each bin, derive a set of moments from the intermediate scale factors, combine the moments into a scaling factor, and scale the data representations by the scaling factor, and decoding circuitry configured to decode scaled data representations.

In a first implementation of such apparatus, the processing circuitry may be configured to determine a set of log-likelihood ratio (LLR) values from the data bits.

In a second implementation of such apparatus, the processing circuitry may be configured to determine a set of values from the data bits based on channel estimates.

In a third implementation of such apparatus, the processing circuitry may be configured to, when the data bits are encoded with a low-density parity-check (LDPC) code, adjust the distribution based on parameters of the data bits.

In a first variant of that third implementation, the processing circuitry may be configured to adjust the distribution based on at least one of (a) a number of shortening bits per codeword, (b) a number of punctured bits per codeword, and (c) a number of repeated bits per codeword.

In a second variant of that third implementation, the processing circuitry may be configured to combine the moments in a weighted summation.

In a third variant of that third implementation, the processing circuitry may be configured to apply the moments to a machine learning model.

In a fourth implementation of such apparatus, the processing circuitry may be further configured to monitor channel characteristics of different channels, where the processing circuitry may be configured to perform at least one of the assigning, the deriving and the combining is performed differently for different channels according to the channel characteristics, and the processing circuitry may be configured to assign a different scaling factor at least one channel as compared to other channels.

In a fifth implementation of such apparatus, the processing circuitry may be further configured to discard data representations below a noise threshold, and base the intermediate scale factors on noise variance.

In a sixth implementation of such apparatus, the processing circuitry may be further configured to combine the moments into a scaling factor by grouping the bins into ranges, and deriving separate scaling factors for each range.

In a seventh implementation of such apparatus, the processing circuitry may be further configured to operate iteratively, and to scale down the data representations on later iterations to avoid saturation.

In an eighth implementation of such apparatus, the processing circuitry may be further configured to apply a correction factor to update the scaling factor for later data bits in a packet.

According to implementations of the subject matter of this disclosure, a method of decoding data representations derived from a communications channel includes receiving data bits corresponding to encoded data in the communications channel, determining a set of data representations from the data bits, scaling the data representations by a scaling factor to fit a dynamic range, sending the scaled data representations to a decoder, iteratively performing the sending until a stop condition is met, and scaling down the data representations on later iterations to avoid saturation.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
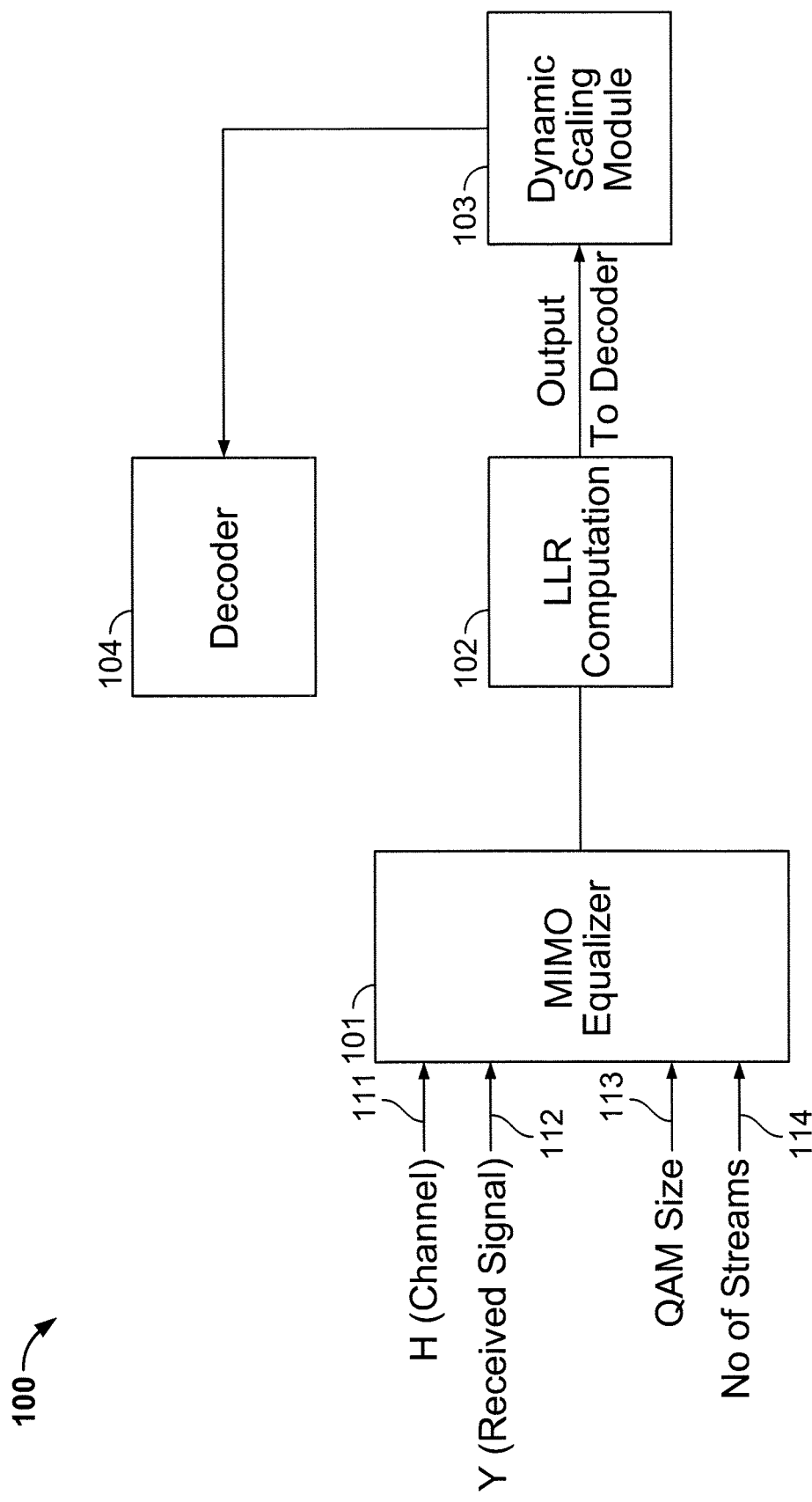
FIG. 1 is a block diagram illustrating an example circuit structure of a wireless receiver employing LLR-based dynamic scaling, according to some implementations of this disclosure.

A decoder, such as a low-density parity-check (LDPC) decoder, a binary convolution code (BCC) decoder, or any other binary combinatory decoder, is configured to decode a code block containing a plurality of data bits. As part of the decoding of received data bits, an LLR value of each data bit is generated, based on which the decoder decides whether the data bit is '0' or '1'. For example, for each received data bit, the LLR may be calculated as:

$$LLR = \log\left(\frac{\text{Probability of the data bit being equal to 0}}{\text{Probability of the data bit being equal to 1}}\right)$$

Using that definition, a positive LLR indicates a greater probability of the data bit being equal to 0, while a negative LLR indicates a greater probability of the data bit being equal to one. The magnitude of the LLR provides a reliability of the estimation—e.g., |LLR|=0 indicates the estimation is unreliable as the data bit has an equal chance of being '0' or '1'; and |LLR| being a higher value indicates that a conclusion that the data bit value is '0' or '1' is more reliable.

Fixed-point LLR processing circuitry at a receiver may include a certain number of bits to represent the LLR values. If all of the LLR values have relatively low magnitudes, the more significant bits of the LLR processing circuitry could go unused while the relatively low LLR magnitudes are represented by a smaller number of bits, providing lower resolution in the calculations. Therefore, it is known to configure the LLR processing circuitry to scale the LLR values corresponding to the received data bits such that the scaled LLR values occupy a maximum value range defined by the number of data bits available to represent the LLR values. For example, if 10 bits are available to represent LLR values (for a maximum magnitude of 512), but all LLR values in a particular received signal have a magnitude of 2 or less, scaling (i.e., multiplying) all LLR values by 256 would provide greater resolution without causing any single LLR value to overflow the available number of bits.

The distribution of LLR values even within the same data packet can vary with channel conditions, MCS, the received signal power level, or the like. Finding a particular scaling factor for all received data bits across all different scenarios can be difficult.

In some implementations, it may not be possible to determine actual LLR values. In such cases, other data representations may be used. For example, in U.S. Patent Publication 2019/0222225, which is hereby incorporated by reference herein in its entirety, channel estimates, which may be based on long training fields (LTFs), may be used in place of LLRs.

In accordance with implementations of the subject matter of this disclosure, scaling factors may be obtained that can be used across all data representations (whether those data representations are LLR values or other data representations) corresponding to data bits in a received packet. Alternatively, in a nonlinear approach, the LLR values may be broken into groups, with different scaling factors applied to different groups, based, e.g., on channel conditions, MCS, received signal power level, etc.

Implementations of the subject matter of this disclosure are dynamic, in that the scaling factor can be changed over time as channel conditions change. However, scaling factors should not change during decoding of a codeword. Therefore, in implementations of the subject matter of this disclosure, each codeword is decoded using a scaling factor derived during processing of a previous codeword. If, during processing of a codeword, it is determined that the scaling factor should change, then the change is applied at the beginning of the next codeword. Indeed, as additional packets of the current codeword are processed, the scaling factor may change more than once, but a scaling factor will take effect only at a codeword boundary; therefore, some scaling factors that are derived may never take effect. Although a scaling factor will not take effect when derived, but only at the next codeword boundary, the effect on decoding of the current codeword, using a previously-derived scaling factor, is not expected to be significant except in rare circumstances of an abrupt change in channel conditions.

FIG. 1 is a block diagram illustrating an example circuit structure of a wireless receiver employing LLR-based dynamic scaling, according to some implementations of this disclosure. A wireless receiver 100 is configured to be operated under a variety of wireless protocols, such as various versions of the IEEE 802.11 standard, or the like. The wireless receiver 100 includes a multiple-input multiple-output (MIMO) equalizer 101, which is configured to quantize a received signal from a channel. For example, the received signal from the channel may include information such as, but not limited to, channel information 111, a data signal 112, information relating to the modulation scheme (e.g., the QAM size) 113, the number of data streams 114 from the channel, or the like.

In such an implementation, the MIMO equalizer 101 may be configured to send quantized data bits to an LLR computation module 102, which is in turn configured to calculate LLR values for each data bit, and to generate an LLR histogram based on the calculated LLR values LLR computation module 102 is configured to send LLR values and/or LLR histogram information to a dynamic scaling module 103, which is configured to determine a scaling factor based on the LLR histogram, as described in more detail below. The dynamic scaling module 103 may be configured to send the scaled LLR values to the decoder 104.

Figure 2:
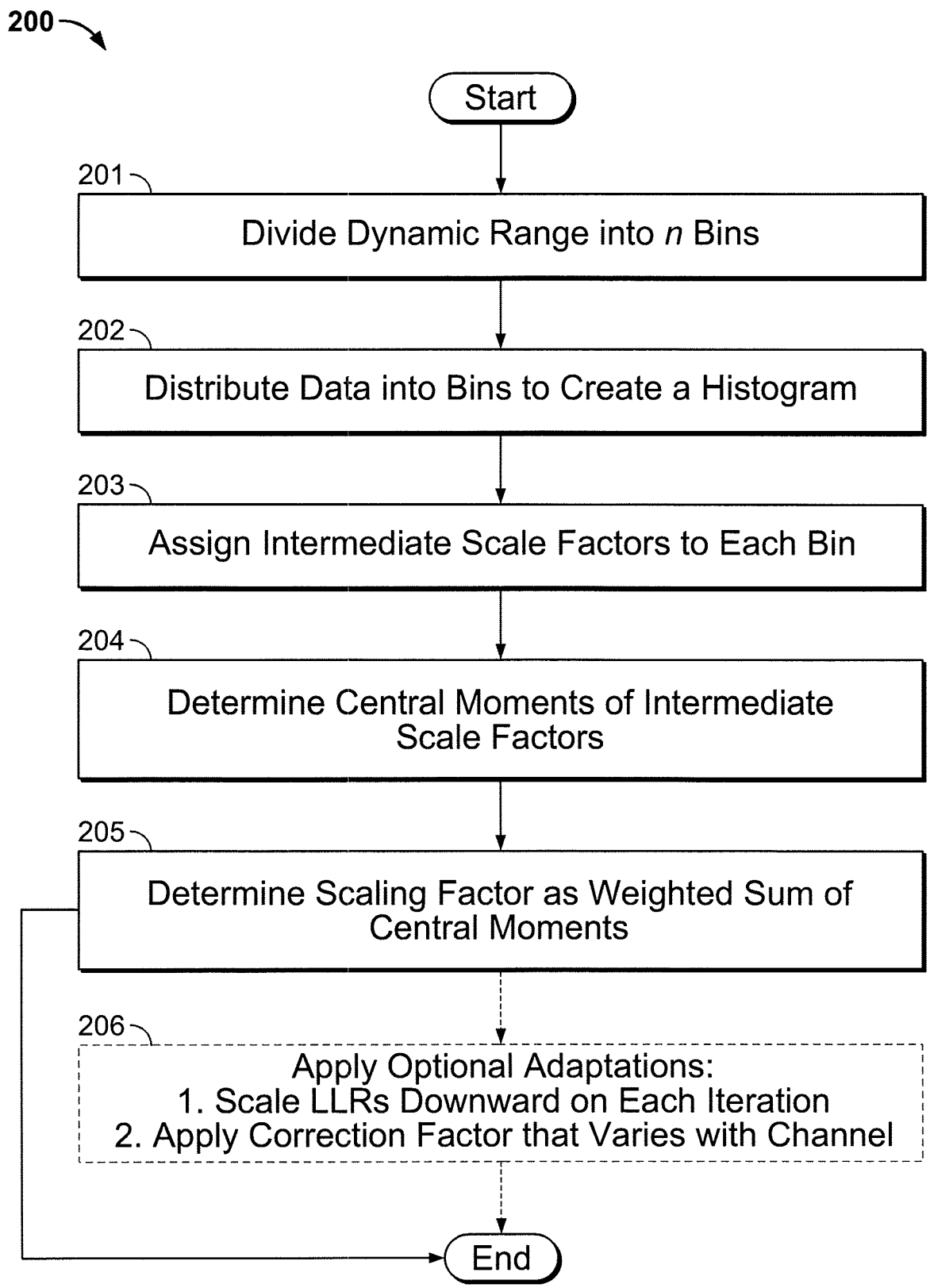
FIG. 2 is a flow diagram of a method, in accordance with implementations of the subject matter of this disclosure, for dynamically finding a scaling factor.

An implementation, according to the subject matter of this disclosure, of a method 200 for dynamically finding the scaling factor in dynamic scaling module 103 is diagrammed in FIG. 2. First, at 201, the entire dynamic range is divided into n+1 bins ($b_0$, $b_1$, $b_2$, . . . , $b_n$). The value of n can be chosen based on various parameters of the system, including the accuracy required by the system—i.e., the more bins for are used, the greater the accuracy becomes. The bins can be distributed linearly or non-linearly (e.g., logarithmically).

At 202, data is distributed into the aforementioned bins to create a histogram. The histogram can be created using known techniques such as distributing the least or most reliable bits of LLRs, or a combination of LLR bits of various reliabilities in various ratios, as set forth in copending U.S. patent application Ser. No. 15/792,348, filed Oct. 24, 2017, which is hereby incorporated by reference herein in its entirety. Alternatively, the histogram may be created from data representing channel-squared norms based on LLRs derived from long training fields, as set forth in above-incorporated U.S. Patent Publication 2019/0222225). Regardless of which of the foregoing techniques, or any other technique, is used, the LLRs from which the histogram is derived may be limited to LLRs corresponding to the codeword of interest—i.e., the codeword currently being decoded. The probability mass function (i.e., the fractional number of LLRs in each bin) may be represented as $H_i$ (i=0, 1, 2, . . . , n).

At 203, intermediate scale factors $s_i$ (i=0, 1, 2, . . . , n) are assigned to each bin. The value of each of the scale factors $s_k$ may be chosen as that number that would scale all LLRs over the desired range if all of the LLR values in the histogram were found in the bin $b_k$. Optionally, an offset can be added to that value. If the bins are linearly spaced (see above), the intermediate scale factors $s_i$ can be multiples of a scalar value. If the bins are logarithmically spaced (see above), the intermediate scale factors $s_i$ can be powers of a scalar value. Alternatively, the intermediate scale factors $s_i$ can be derived empirically based on the system setup.

After the intermediate scale factors $s_i$ have been derived, at 204, the central moments $\mu_i$ of the intermediate scale factors $s_i$ are derived:

$$\mu_i = \left( \sum_{k=0}^{n} (s_k - \mu_1)^i * H_k \right)^{\frac{1}{i}}$$

As is known, the first central moment $\mu_1$ is the mean:

$$\mu_1 = \sum_{k=0}^{n} s_k * H_k$$

The second central moment $\mu_2$ is the variance $\sigma^2$, where $\sigma$ is the standard deviation. The third and fourth central moments $\mu_3$ and $\mu_4$ define skewness and kurtosis, respectively.

For linearly spaced bins [M(n−1), Mn]:

$$\mu_i = \left( \sum_{k=0}^{n} \left( \frac{s_k}{M} - \mu_1 \right)^i * H_k \right)^{\frac{1}{i}}$$

For logarithmically spaced bins [$M^{(n-1)}$, $M^n$]:

$$\mu_i = \left( \sum_{k=0}^{n} (\log_M s_k - \mu_1)^i * H_k \right)^{\frac{1}{i}}$$

After the central moments $\mu_i$ of the intermediate scale factors $s_i$ have been derived, at 205 the scaling factor may be determined as a weighted sum of the central moments $\mu_i$:

$$\alpha + \sum_{i=1}^{N} \beta_i \mu_i$$

where α is the mean error deviation, and the values $\beta_i$ are weights, which can be determined for each system based on empirical analysis.

As noted above, this method may be used for any binary combinatory decoder including a binary convolution code (BCC) decoder, as well as a low-density parity-check (LDPC) decoder. For example, for one sample WLAN configuration using LDPC coding, α=−1.6, N=2, $\beta_1$=1, and $\beta_2$=0.6, so that the scaling factor is:

$-1.6+\mu_1+0.6\ \mu_2$

However, this is just an example for one particular LDPC WLAN configuration.

In addition, in the case of LDPC codes in particular, there may be additional parameters that affect the LLR values and therefore the formation of the histogram. Specifically, the following LDPC coding parameters:

Number of shortening bits per codeword;
Number of punctured bits per codeword; and
Number of repeated bits per codeword may influence the LLR histogram and therefore the LLR scaling factors.

Figure 3:
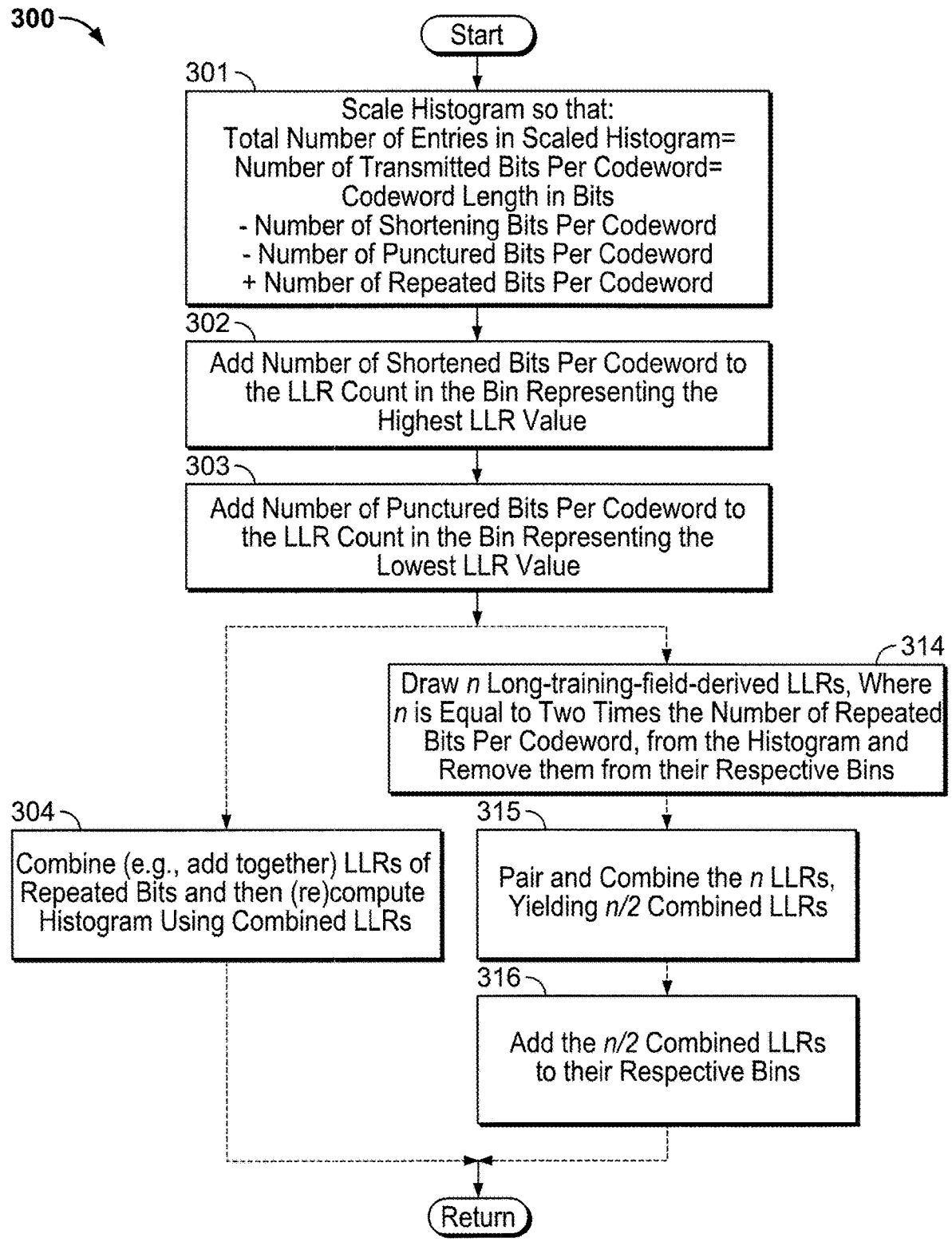
FIG. 3 is a flow diagram of a further method, in accordance with implementations of the subject matter of this disclosure, for dynamically finding a scaling factor, accounting for additional coding parameters.

FIG. 3 is a diagram showing one method 300 in accordance with implementations of the subject matter of this disclosure to account for the listed LDPC coding parameters. At 301, the histogram is scaled so that the total number of entries in the scaled histogram is equal to the number of transmitted bits per codeword, which is equal to the codeword length in bits, minus the number of shortening bits per codeword, minus the number of punctured bits per codeword, plus the number of repeated bits per codeword. This reflects the number of bits actually transmitted over the air. Specifically, if the number of entries in the histogram is greater than the number of transmitted bits per codeword, then the count in each bin of the histogram is multiplied by the ratio of the number of transmitted bits per codeword to the number of entries in the histogram; if the number of entries in the histogram is less than the number of transmitted bits per codeword, then the count in each bin of the histogram is multiplied by the ratio of the number of entries in the histogram to the number of transmitted bits per codeword.

After the scaling operation at 301, at 302, the number of shortened bits per codeword is added to the LLR count in the bin representing the highest LLR magnitude (because shortened bits are considered to have very high—essentially infinite—LLR magnitudes). At 303, the number of punctured bits per codeword is added the LLR count in the bin that represents the lowest LLR magnitude (because punctured bits are considered to have very low—essentially zero—LLR magnitudes).

The number of repeated bits per codeword may be accounted for in one of at least two ways, shown as alternatives at 304 and at 314-316, depending on whether the LLRs in question are data LLRs or long-training-field-derived LLRs. At 304, for data LLRs, the LLRs of repeated bits are combined (e.g., added together) before the histogram is computed, and then the combined LLRs are used to compute the histogram.

At 314, for long-training-field-derived LLRs, the histogram is computed initially and then n LLRs, where n is equal to two times the number of repeated bits per codeword, are drawn from the histogram. n bins are selected probabilistically, with the probability of selection of any particular bin being proportional to its LLR count. For each bin that is selected, an LLR value is drawn uniformly randomly from the range of values found in that bin—i.e., a random value from that bin will be selected, with each value in the bin having an equal probability of selection. At 315, the n LLRs are paired and combined, yielding n/2 combined LLRs. Pairing can be performed randomly or, because the process of the drawing the n LLRs is itself random, neighboring LLRs can be paired and combined without further selection. At 316, the n/2 combined LLRs are added to their respective bins, resulting in a revised histogram.

From 304 or 316, flow returns, for example, to 203.

In a variation in accordance with implementations of the subject matter of this disclosure to account for the LDPC coding parameters listed above, the coding parameters themselves may be considered as additional input parameters of the scaling factor computation at, e.g., 205. For example, the three parameters—number of shortening bits per codeword, number of punctured bits per codeword, and number of repeated bits per codeword—may be designated as $\delta_1$, $\delta_2$, $\delta_3$. And the scaling factor can be determined as $$\alpha = \alpha + \sum_{i=1}^{N} \beta_i \mu_i + \sum_{k=1}^{3} \gamma_k \delta_k$$

where the coefficients $\gamma_k$ (as well as the coefficients α and $\beta_i$) may be dependent on the MCS (modulation and coding scheme) being used. For example, α, $\beta_i$ and $\gamma_k$, may be dependent on the modulation scheme in use (e.g., BPSK, QPSK, 16 QAM, 256 QAM, etc.) Similarly, α, $\beta_i$ and $\gamma_k$, may be dependent on the coding rate in use (e.g., ½, ⅔, ⅚, etc.).

In at least one implementation, a machine learning approach is used to select a "best" scaling factor out of a number of possible scaling factors that all may be valid based on the various parameters. Because decoders such as LDPC decoders operate iteratively until a stopping condition is met, the "best" scaling factor may be defined as the scaling factor that results in the smallest number of LDPC iterations. If there is more than one scaling factor that meets that criterion, a rule may be used to select from among those scaling factors that meet the criterion. For example, the rule may be that of all scaling factors that result in the smallest number of LDPC iterations, the scaling factor whose value is intermediate the values of the other scaling factors that meet the criterion. The best scaling factor can be computed offline for certain cases, and can then be used as training data for a machine learning approach.

In some implementations, the feature set for a machine learning approach may include a histogram of the LLRs, the moments of the histogram, and the coding parameters. Support vector machines (SVMs) and neural networks are among the types of machine learning environments that can be used. The machine learning techniques can include linear regression or other cost functions to quantify the quality of curve fitting. For example, mean square error (MSE) can be used to obtain a least-squares solution. As noted above, training can be done offline and a best fit curve can be obtained for each given system.

Different machine learning models can be trained for different classes of channels. For example, channels may differ according to their channel quality and frequency selectivity, which can be derived from histogram parameters. For example, an adaptive white Gaussian noise (AWGN) type channel has LLRs concentrated in the higher value bins and has a low spread. On the other hand, a frequency selective channel may have more of a spread across the histogram, generally occupying the entire range. Therefore, different scaling models can be applied to different types of channels, as identified according to these or other classification techniques. Such a differential approach to different channel types may be applied for both LDPC decoding and BCC decoding.

Although the discussion so far has assumed that a single scaling factor is to be determined for, and applied to, the entire range of LLRs, a non-linear approach may be applied, where different scaling factors are applied to different ranges of LLRs. For example, if there is a wide variation in LLR values, the scaling factor used for the lower LLR values may cause saturation in the higher LLR values. But if a lower scaling factor is applied to prevent saturation in the higher LLR values, there may be a loss of available resolution in processing the lower LLR values.

As an example, suppose that the full range of LLR values may be partitioned into three subranges by values $R_1$ and $R_2$. Three different scaling factors can be applied:

1. For $0 \leq |\text{Data LLRs}| < R_1$, apply $$\text{Scaling factor}^{[1]} = \alpha^{[1]} + \sum_{i=1}^{N} \beta_i^{[1]} \mu_i + \sum_{k=1}^{3} \gamma_k^{[1]} \delta_k$$

2. For $R_1 \leq |\text{Data LLRs}| < R_2$, apply $$\text{Scaling factor}^{[2]} = \alpha^{[2]} + \sum_{i=1}^{N} \beta_i^{[2]} \mu_i + \sum_{k=1}^{3} \gamma_k^{[2]} \delta_k$$

3. For $|\text{Data LLRs}| \geq R_2$, apply $$\text{Scaling factor}^{[3]} = \alpha^{[3]} + \sum_{i=1}^{N} \beta_i^{[3]} \mu_i + \sum_{k=1}^{3} \gamma_k^{[3]} \delta_k$$

where:
$\alpha^{[j]}$ is the mean error deviation; and
$\beta_i^{[j]}$ is the scale applied for $\mu_i$ for the range $|\text{Data LLRs}| \in [R_{j-1}, R_j]$.

As discussed above, generally, larger scaling factors will be needed for lower LLR values while smaller scaling factors will be needed for higher LLR values. Thus, the general trend will be $$\text{Scale factor}^{[k]} \geq \text{Scale factor}^{[k+1]}$$

The previous discussion of a linear approach, having one scaling factor for all LLR values, may be considered a special case of this non-linear approach in which the boundary value $R_1$ is infinite or has a maximum possible value.

In the non-linear approach, the scaling factors may be found using machine learning approaches similar to those used in the linear approach as described above. The parameters to be trained are $\{\alpha^{[j]}, \beta_i^{[j]}, \gamma_k^{[j]}\}$ for each region, as well as the boundary values $\{R_1, R_2, \ldots\}$ with $(R_1 < R_2 < \ldots)$.

Figure 4:
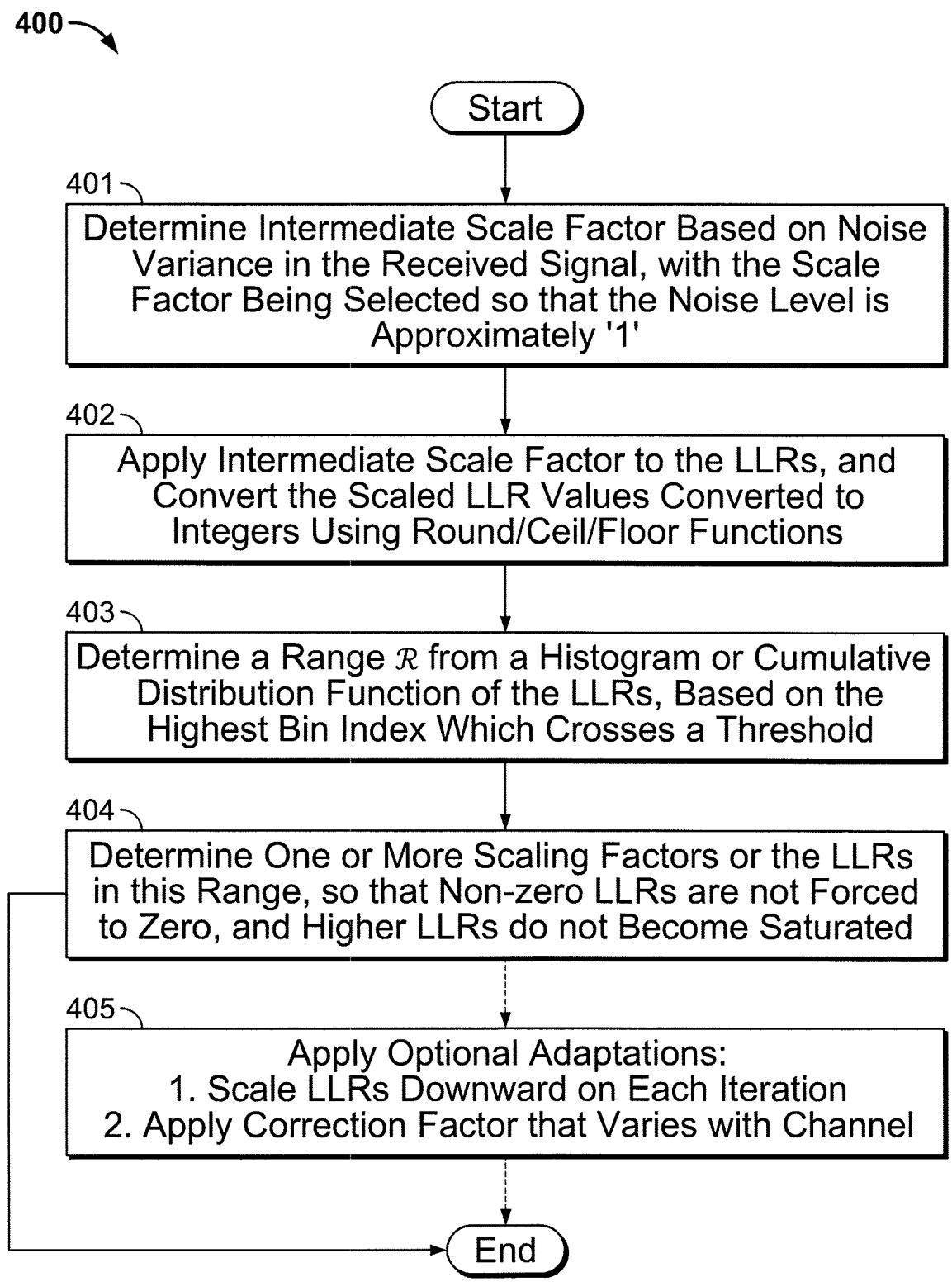
FIG. 4 is a flow diagram of a further method, in accordance with implementations of the subject matter of this disclosure, for dynamically finding a scaling factor, based on noise variance in the received signal.

In other implementations, as a variation of the foregoing methods of determining the scaling factor, the scaling factor could be determined based on noise variance in the received signal. One such implementation 400 is diagrammed in FIG. 4.

At 401, an intermediate scale factor, similar to the intermediate scale factor discussed above, is determined based on noise variance in the received signal, with the scale factor being selected so that the noise level is approximately '1'. The scale factor may be a function f of the noise variance $\sigma_n$. In one implementation $f(\sigma_n^2) = \sqrt{\sigma_n^2}$ (i.e., the standard deviation). More generally, the scale factor may be determined using a polynomial function of the noise variance:

$$\text{scale\_factor} = \gamma_0 + \sum_{k=1}^{K} \gamma_k \left(\sqrt{\sigma_n^2}\right)^k + \sum_{k=1}^{K} \gamma_{-k} \left(\sqrt{\sigma_n^2}\right)^{-k}$$

This also accounts for the coding parameters discussed above, with the polynomial coefficients determined by machine learning as discussed.

At 402, the intermediate scale factor is applied to the LLRs, and the scaled values are converted to integers using round/ceil/floor functions. Conversion to integer values further reduces the effect of noise on the values. Therefore, the LLRs should be able to be scaled without losing information content; non-zero LLRs should not be forced to zero, and higher LLRs should be less likely to become saturated.

At 403, a range $\mathcal{R}$ is determined from a histogram or cumulative distribution function of the LLRs, based on the highest bin index which crosses a threshold that has been determined, e.g., through numerical analysis or machine-learning techniques. At 404, one or more scaling factors are determined for the LLRs in this range, to meet the conditions set forth above—i.e., non-zero LLRs should not be forced to zero, and higher LLRs should be less likely to become saturated. This may be accomplished using a non-linear approach, with the region partitions and resultant scaling factors determined as described above. Alternatively, the region partitions and scaling factors may be based on a function of $\mathcal{R}$ and $\sigma_n^2$.

Regardless of the method used to determine the scaling factor or factors, various adaptations, shown as options at 206 or 405, may be applied over time, as follows.

First, LLR magnitudes can be expected to increase after every iteration. Without correction, the higher LLRs will eventually saturate at a maximum value, reducing the effectiveness of higher LLRs in correcting weaker LLRs. Therefore, according to some implementations the LLRs are scaled downward after every iteration of the decoding process. This adaptive scaling could be based simply on the iteration count, or alternatively, the actual LLR values after each iteration can be examined, and scaled down to fit a desired range.

Second, a channel may vary over time. This may not matter for shorter packets, but if the channel variation is large enough, it may matter for longer packets. A scaling factor correction factor may be applied. The correction factor should be a function of the length of the packet. For example, the scaling factor determined as described above may be multiplied by a correction factor $\Gamma(n)$, where n is the number of the symbol in the packet. As a simple example, $$\Gamma(n) = \alpha \times n$$

where $\alpha$ is a fixed scalar value. However, the scaling factor should not be changed in the middle of a codeword. Thus, if a new scaling factor is derived based on the correction factor, the new scaling factor should not be applied until a codeword boundary is reached.

Thus it is seen that fixed-point LLR processing circuitry for a receiver, with LLR scaling to maximize resolution without overflow, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of decoding data representations derived from a communications channel, the method comprising:
   receiving data bits corresponding to encoded data in the communications channel;
   determining a set of data representations from the data bits;
   distributing the set of data representations into bins across a dynamic range to generate a distribution of the data representations;
   assigning a respective intermediate scale factor to each bin;
   deriving a set of moments from the intermediate scale factors;
   combining the moments into a scaling factor;
   scaling the data representations by the scaling factor; and
   sending the scaled data representations to a decoder.

2. The method of claim 1 wherein the determining a set of data representations from the data bits comprises determining log-likelihood ratio (LLR) values from the data bits.

3. The method of claim 1 wherein the determining a set of data representations from the data bits comprises determining values from the data bits based on channel estimates.

4. The method of claim 1 wherein the distributing the set of data representations comprises generating a histogram.

5. The method of claim 1 wherein the distributing the set of data representations comprises generating a cumulative distribution function.

6. The method of claim 1 further comprising, when the data bits are encoded with a low-density parity-check (LDPC) code, adjusting the distribution based on parameters of the data bits.

7. The method of claim 6 wherein the adjusting the distribution based on parameters of the data bits comprises adjusting the distribution based on at least one of (a) a number of shortening bits per codeword, (b) a number of punctured bits per codeword, and (c) a number of repeated bits per codeword.

8. The method of claim 1 wherein the combining the moments comprises combining the moments in a weighted summation.

9. The method of claim 1 wherein the combining the moments comprises applying the moments to a machine learning model.

10. The method of claim 1 further comprising:
    monitoring channel characteristics of different channels;
    wherein:
    at least one of the assigning, the deriving and the combining is performed differently for different channels according to the channel characteristics; and
    at least one channel has a different scaling factor than other channels.

11. The method of claim 1 further comprising:
    discarding data representations below a noise threshold;
    wherein:
    the intermediate scale factors are based on noise variance.

12. The method of claim 1 wherein the combining the moments into a scaling factor comprises:
    grouping the bins into ranges; and
    deriving separate scaling factors for each range.

13. The method of claim 1 wherein the method is iterative and comprises scaling down the data representations on later iterations to avoid saturation.

14. The method of claim 1 further comprising applying a correction factor to update the scaling factor for later data bits in a packet.

15. Apparatus for decoding data representations derived from a communications channel, the apparatus comprising:
    a receiver configured to receive data bits corresponding to encoded data in the communications channel;
    processing circuitry configured to:
    determine a set of data representations from the data bits,
    distribute the set of data representations into bins across a dynamic range to generate a distribution of the data representations,
    assign a respective intermediate scale factor to each bin,
    derive a set of moments from the intermediate scale factors,
    combine the moments into a scaling factor, and
    scale the data representations by the scaling factor; and
    decoding circuitry configured to decode scaled data representations.

16. The apparatus of claim 15 wherein the processing circuitry is configured to determine a set of log-likelihood ratio (LLR) values from the data bits.

17. The apparatus of claim 15 wherein the processing circuitry is configured to determine a set of values from the data bits based on channel estimates.

18. The apparatus of claim 15 wherein the processing circuitry is configured to, when the data bits are encoded with a low-density parity-check (LDPC) code, adjust the distribution based on parameters of the data bits.

19. The apparatus of claim 18 wherein the processing circuitry is configured to adjust the distribution based on at least one of (a) a number of shortening bits per codeword, (b) a number of punctured bits per codeword, and (c) a number of repeated bits per codeword.

20. The apparatus of claim 18 wherein the processing circuitry is configured to combine the moments in a weighted summation.

21. The apparatus of claim 18 wherein the processing circuitry is configured to apply the moments to a machine learning model.

22. The apparatus of claim 15 wherein the processing circuitry is further configured to:
    monitor channel characteristics of different channels;
    wherein:
    the processing circuitry is configured to perform at least one of the assigning, the deriving and the combining is performed differently for different channels according to the channel characteristics; and
    the processing circuitry is configured to assign a different scaling factor at least one channel as compared to other channels.

23. The apparatus of claim 15 wherein the processing circuitry is further configured to:
    discard data representations below a noise threshold; and
    base the intermediate scale factors on noise variance.

24. The apparatus of claim 15 wherein the processing circuitry is further configured to combine the moments into a scaling factor by:
   grouping the bins into ranges; and
   deriving separate scaling factors for each range.

25. The apparatus of claim 15 wherein the processing circuitry is further configured to:
   operate iteratively; and
   scale down the data representations on later iterations to avoid saturation.

26. The apparatus of claim 15 wherein the processing circuitry is further configured to apply a correction factor to update the scaling factor for later data bits in a packet.

27. A method of decoding data representations derived from a communications channel, the method comprising:
   receiving data bits corresponding to encoded data in the communications channel;
   determining a set of data representations from the data bits;
   scaling the data representations by a scaling factor to fit a dynamic range;
   sending the scaled data representations to a decoder;
   iteratively performing the sending until a stop condition is met; and
   scaling down the data representations on later iterations to avoid saturation.

* * * * *